(12) United States Patent
Hubner et al.

(10) Patent No.: US 7,814,861 B2
(45) Date of Patent: Oct. 19, 2010

(54) METHOD AND DEVICE FOR COATING PRINTED CIRCUIT BOARDS

(75) Inventors: Marc Hubner, Therwil (CH); Thomas Echensperger, Therwil (CH)

(73) Assignee: all4-Holding AG, Therwil (CH)

( * ) Notice: Subject to any disclaimer, the term of this patent is extended or adjusted under 35 U.S.C. 154(b) by 827 days.

(21) Appl. No.: 11/710,211

(22) Filed: Feb. 23, 2007

(65) Prior Publication Data

US 2008/0069946 A1    Mar. 20, 2008

Related U.S. Application Data

(63) Continuation of application No. PCT/EP2005/009099, filed on Aug. 23, 2005.

(30) Foreign Application Priority Data

Aug. 24, 2004   (DE)   .................... 10 2004 040 945

(51) Int. Cl.
    *B05B 15/04*   (2006.01)
(52) U.S. Cl. ..................... 118/301; 118/406
(58) Field of Classification Search ............ 118/301, 118/504–505, 406, 602–603, 302, 70
    See application file for complete search history.

(56) References Cited

U.S. PATENT DOCUMENTS

| | | | |
|---|---|---|---|
| 4,559,896 A | | 12/1985 | Bossard et al. |
| 4,888,200 A | | 12/1989 | Milliken |
| 4,974,532 A | * | 12/1990 | March .................. 118/301 |
| 5,175,018 A | * | 12/1992 | Lee et al. ................. 427/8 |
| 5,733,376 A | * | 3/1998 | Costello .................. 118/668 |

FOREIGN PATENT DOCUMENTS

| | | |
|---|---|---|
| DE | 3642737 A1 | 6/1988 |
| DE | 197 27 078 A1 | 1/1998 |
| DE | 197 35 588 A1 | 2/1999 |
| EP | 0 145 648 A1 | 9/1984 |
| EP | 1 059 249 A1 | 12/2000 |
| GB | 2 021 001 A | 11/1979 |
| GB | 2 053 121 A | 2/1981 |
| WO | WO 92/10303 | 6/1992 |
| WO | WO 2006/021423 A3 | 3/2006 |

OTHER PUBLICATIONS

International Search Report for International Application PCT/EP2005/009099 filed on Aug. 23, 2005.

* cited by examiner

*Primary Examiner*—Brenda A Lamb
(74) *Attorney, Agent, or Firm*—Knobbe Martens Olson & Bear LLP

(57) ABSTRACT

A device for coating printed circuit boards with a fluid coating compound applied to the board surface is disclosed. The device has a conveyor for the printed circuit boards, a sprayer arranged over or under the conveyor, and a covering element on at least one side over an edge area of the printed circuit boards, wherein the area of the covering element covering the edge area of the printed circuit board can be moved away from the printed circuit board. The device also has a wiper, which wipes the coating compound moved away from the printed circuit board off from the covering element and supplies it to a holding tank.

3 Claims, 7 Drawing Sheets

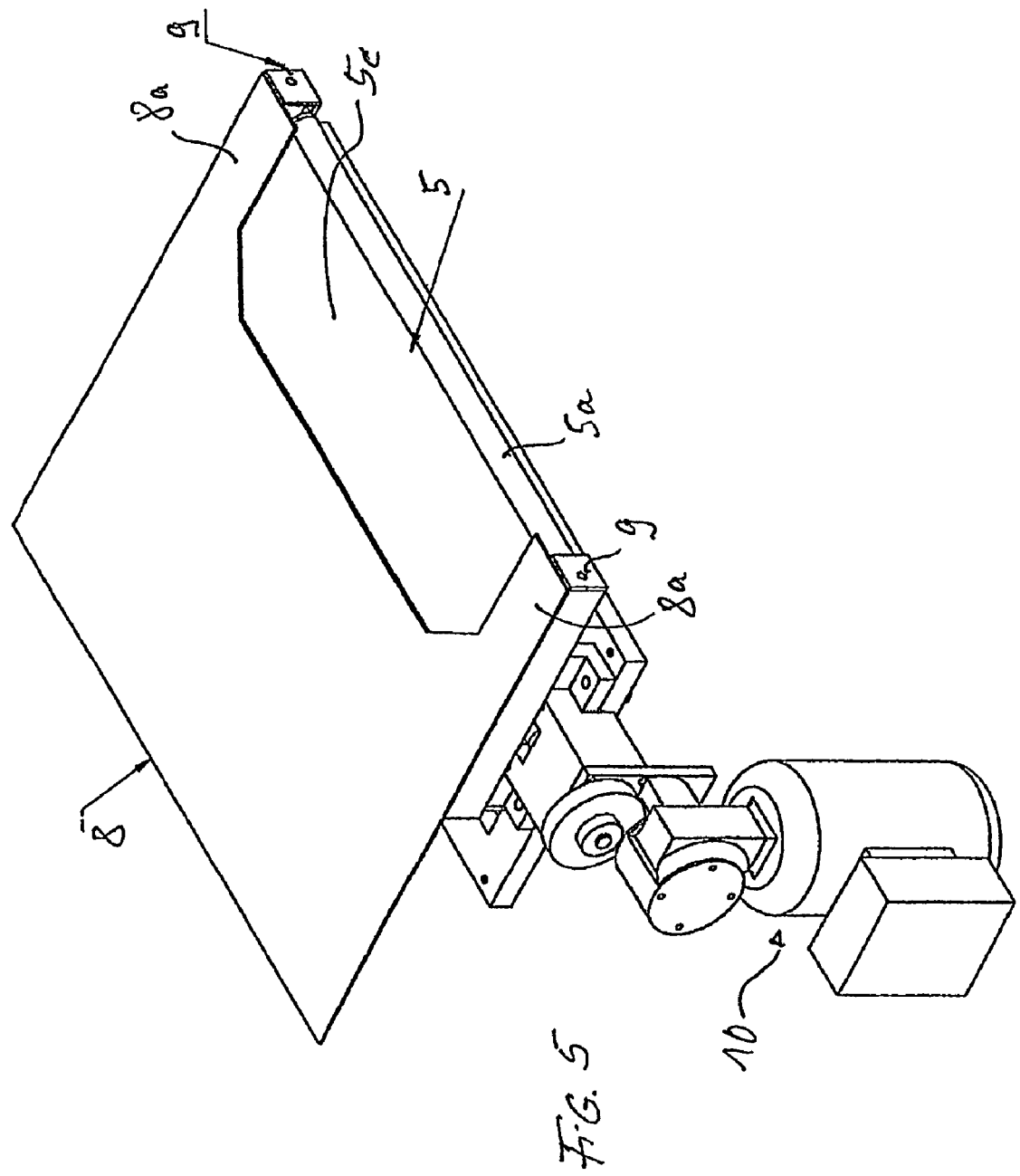

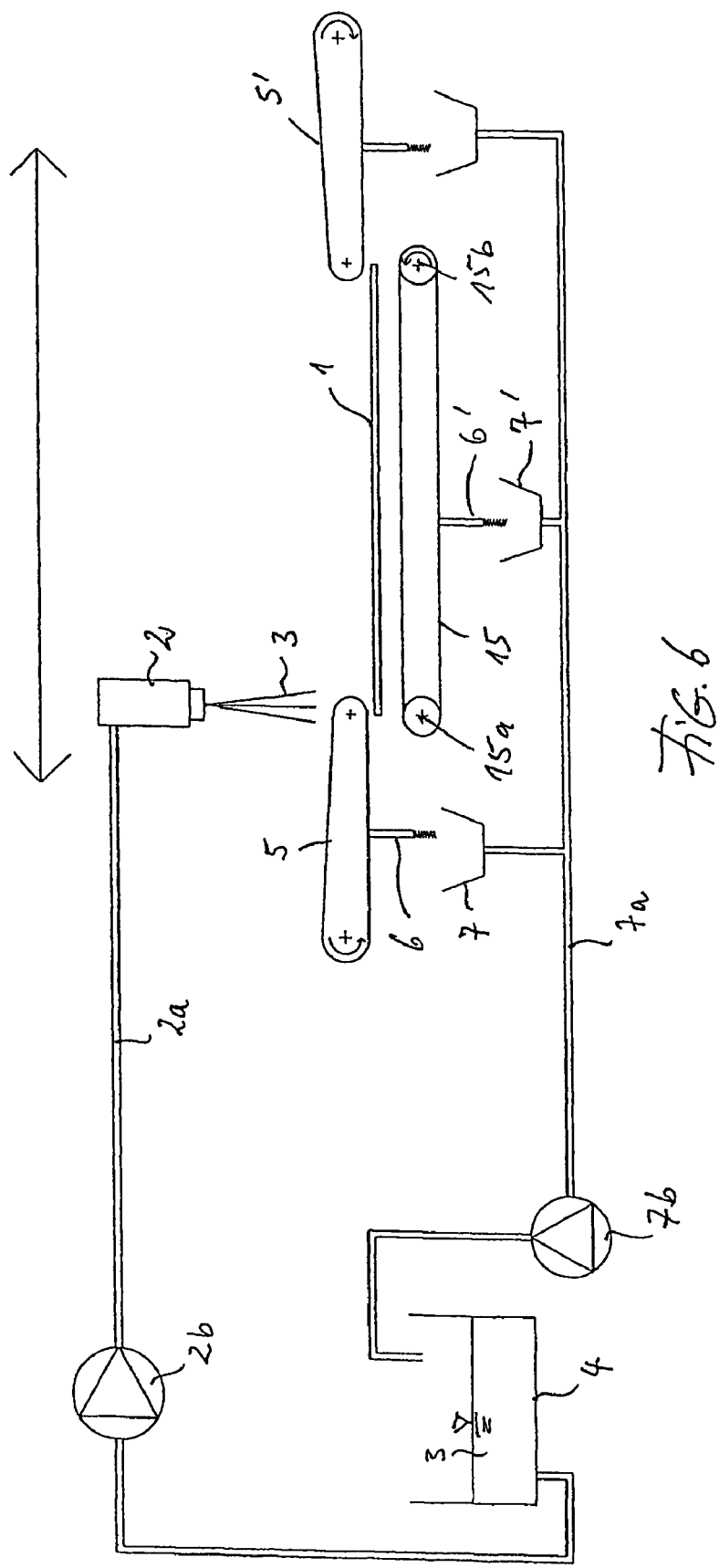

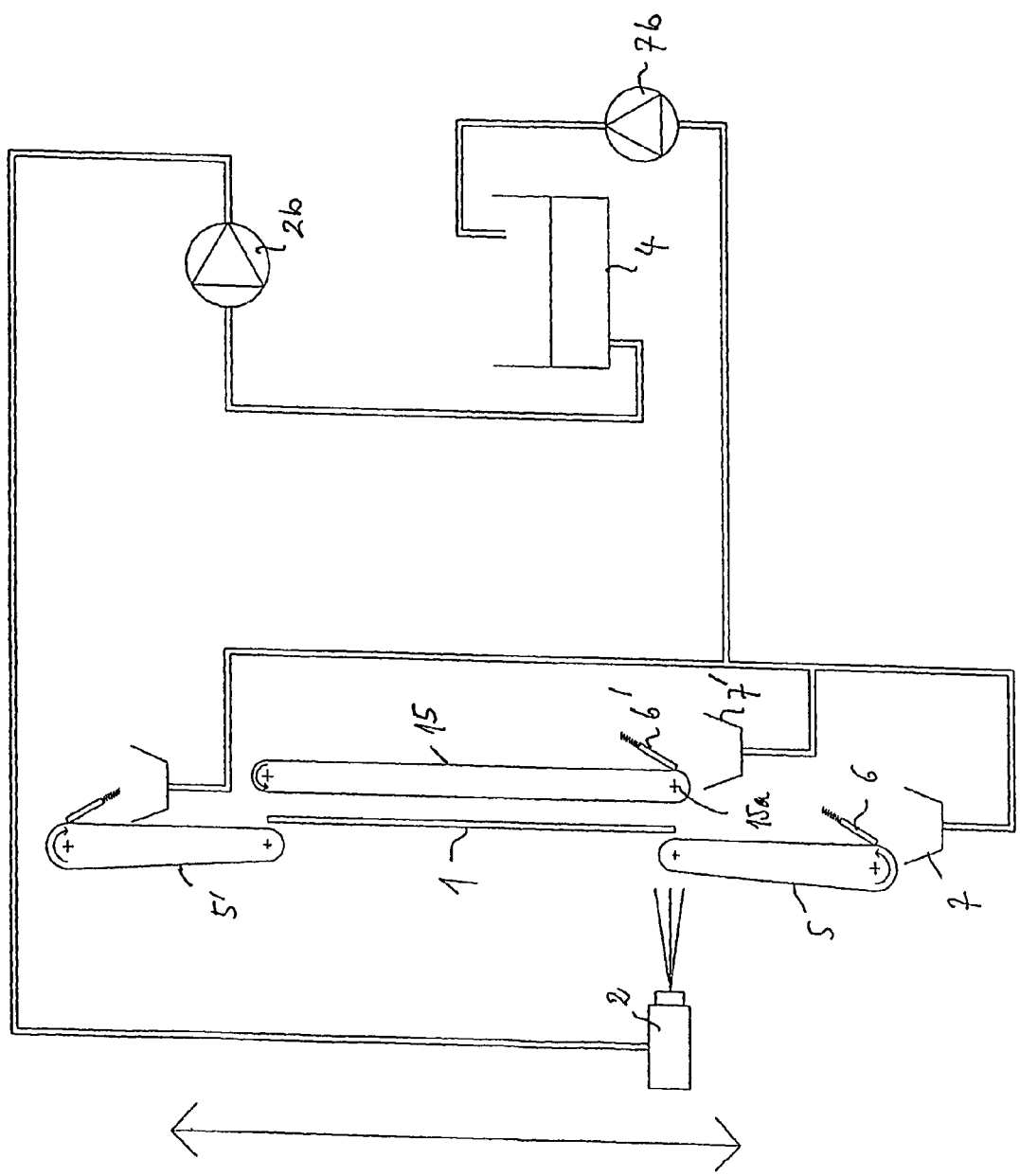

METHOD AND DEVICE FOR COATING PRINTED CIRCUIT BOARDS

CROSS-REFERENCE TO RELATED APPLICATION

This application is a continuation application of international patent application PCT/EP2005/009099, filed Aug. 23, 2005, which claims priority of German patent application DE 10 2004 040 945.5, filed Aug. 24, 2004, the disclosures of which are incorporated herein by reference in their entirety.

BACKGROUND OF THE INVENTION

1. Field of the Invention

The invention relates to a method and a device for coating printed circuit boards as used in electric circuits, integrated circuits and the like.

2. Description of the Related Technology

Printed circuit boards are coated with a fluid coating compound like lacquer, whereupon the coating is dried before the printed circuit boards are processed further. The coating can be applied by having the printed circuit boards on a transport band, and guiding them under a pouring device which produces a pouring curtain falling onto the printed circuit boards. To keep the edges of the printed circuit boards free for grippers and other handling means, covering sheets are used laterally to limit the width of the pouring curtain. Here, it is difficult to avoid extra thickness in the coating at the edges.

The coating can also be applied by spraying the printed circuit boards, wherein problems arise above all in that adjacent machine and conveyor members are also coated with the coating compound and must be cleaned, which is costly. This leads to a correspondingly high consumption of coating compound (overspray). In conventional spray rigs, production has to be interrupted several times a day for cleaning work. This leads to high production costs.

SUMMARY OF CERTAIN INVENTIVE ASPECTS

Some embodiments provide a method and a device of the type mentioned above such that, on uniform application of the coating, the loss of coating compound is kept small and costly cleaning processes become unnecessary.
Wiper

BRIEF DESCRIPTION OF THE DRAWINGS

Embodiments are explained in more detail below with reference to the drawings, in which FIG. 1 diagrammatically shows a coating device, FIG. 5 shows a perspective view of a covering element, FIG. 6 shows a diagrammatic view of another embodiment, and FIG. 7 shows a coating device corresponding to FIG. 3, in which the printed circuit boards are conveyed upright through the spray rig.

DETAILED DESCRIPTION OF CERTAIN INVENTIVE EMBODIMENTS

Figure 1:
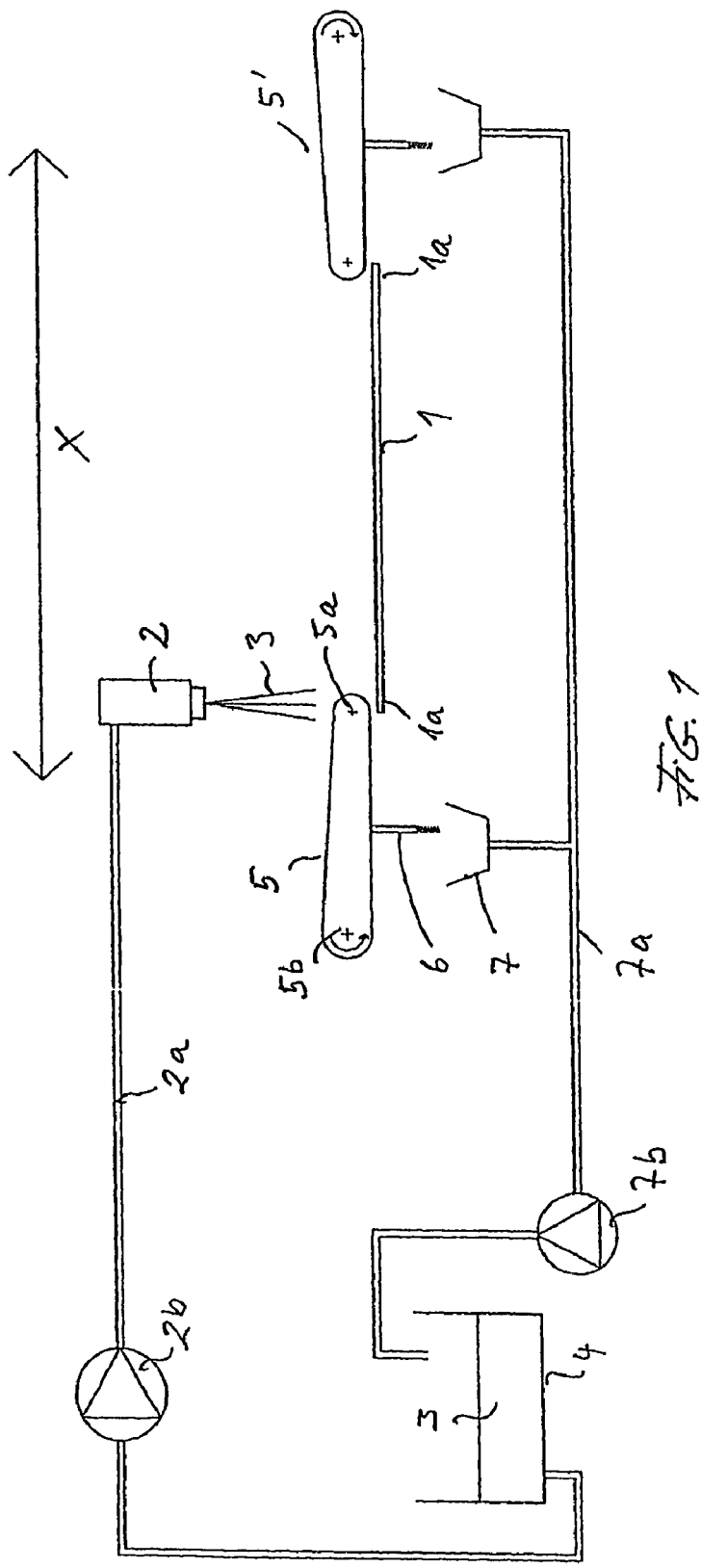

FIG. 1 diagrammatically shows a printed circuit board 1 to be coated, which is moved vertical to the plane of the drawing on a conveyor (not shown), for example a conveyor belt. On the conveyor belt, the printed circuit boards are arranged end-to-end behind one another. Over the printed circuit boards 1, a spray gun 2 is movable back and forth in the direction of the double arrow X over the width of the printed circuit boards, wherein a coating compound 3 is sprayed on through the spray gun 2. The coating compound can be a solder resist, primary resist and the like. The spray rig for applying the coating compound is merely shown simplified in FIG. 1 as a spray gun 2. It can consist of a plurality of spray heads. By means of the spray rig, the printed circuit boards can be provided with coating compound either partly or over their whole surface.

The fluid coating compound 3 is supplied to the spray rig or the spray gun 2 via a pipe 2a from a pump 2b which intakes the coating compound from a holding tank 4. Instead of a holding tank 4 with pump 2b, a pressure tank can also be provided, from which the coating compound is supplied to the spray gun 2.

So that the edge areas of the printed circuit boards 1 remain free of coating compound, in a preferred embodiment revolving belts 5 and 5' are arranged on both sides and are guided around guide rollers 5a, 5b, wherein the guide roller 5a arranged to abut on the printed circuit board 1 is arranged such that it covers the lateral edge area 1a of the printed circuit board with the belt 5 revolving thereon. The coating compound 3 is sprayed onto the belt 5 in the edge area 1a of the printed circuit board 1, so that the edge area remains free of coating compound. Because of the revolving movement of the belt away from the printed circuit board 1 or transverse to the conveying direction, the coating compound applied to the belt is led off from the edge area, and supplied to a wiper 6 which wipes the coating compound from the belt 5. The wiper is shown in a simplified form as a wiping blade 6, under which a funnel 7 is arranged for catching the wiped-off coating compound, and from this funnel the coating compound is supplied to the holding tank 4 via a pipe 7a and a pump 7b.

The belt 5 may revolve around the guide rollers 5a and 5b such that, in the covered area, the belt moves away from the surface of the printed circuit board 1 to be coated, as indicated by arrows in FIG. 1.

Instead of one single guide roller 5a covering the edge area of the printed circuit board, for example, two guide rollers arranged over one another can also be provided, resulting in a vertical section of the course of the belt, or a section thereof inclined diagonally downward and outward or otherwise, in the covered area.

The covering element formed by revolving belts 5 on the two sides of the printed circuit board 1 can have a variable distance from one another, so that printed circuit boards of differing width, length and thickness can be coated. The circulating speed of the belts 5 and 5' can be set to depend on the conveying speed of the printed circuit boards 1.

If the printed circuit boards are to be coated over their entire surface, the covering element on both sides can be displaced so far outwards that the printed circuit boards are provided with a coating over their entire surface, while the conveyor members at the sides of the printed circuit boards are covered by the covering element.

The edge area 1a, to which no coating compound is applied, can have a width of, for example, 4 mm, wherein this edge area 1a can be set manually or automatically in dependence on the application process, the thickness of the printed circuit boards and the like.

The edge area 1a can also be independently set mechanically on the left and on the right in the running direction.

The coating device is surrounded by a spray cabin not shown in FIG. 1.

With the described covering element in the form of revolving belts 5, which guide the coating compound accumulating at the edge area away from the printed circuit board and to wiper 6, an adjustable, coating-free surface results in the edge area 1*a*, while simultaneously the conveyor arranged under the printed circuit board 1 is covered so as not to be soiled by atomized spray in the spray cabin. In this way, the conveyor can be operated practically maintenance-free, and operation need not be interrupted for cleaning work. By leading the coating compound in the edge area away and wiping-off by the wiper 6, the loss of coating compound can be kept as small as possible. This is especially advantageous during high lacquer usage, when for example the conveying speed of the printed circuit boards 1 is very high. It can be, for example, up to about 4 m/min.

With the uncoated edge area 1*a*, the handling of the printed circuit boards in the following handling and drying systems is simplified, as the printed circuit boards usually abut in this edge area and/or are gripped by grippers.

Figure 2:
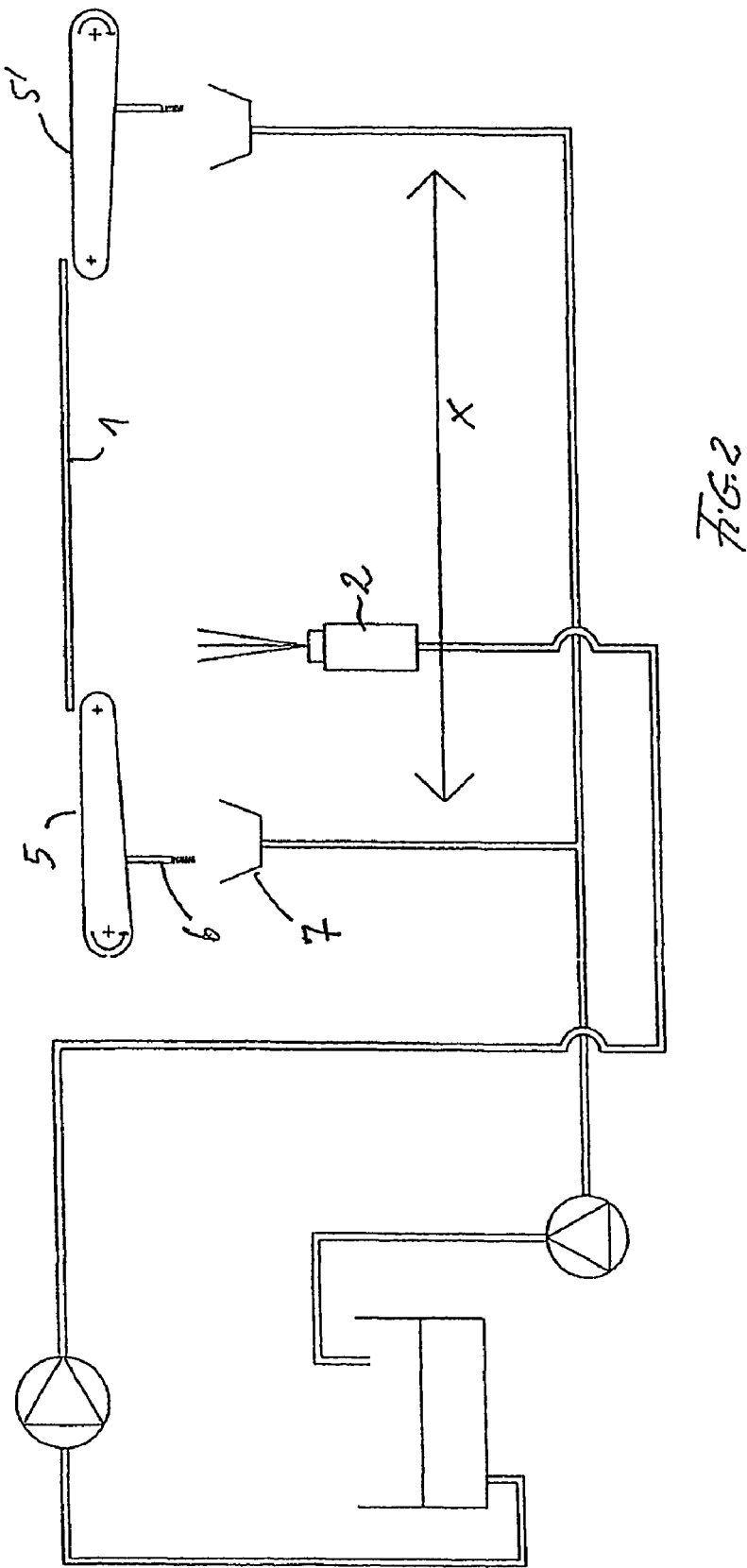
FIGS. 2 and 3 show different arrangements of the coating device.

FIG. 2 shows a coating device corresponding to FIG. 1, wherein the printed circuit board 1 is sprayed with coating compound from below. In a spray rig, the printed circuit boards 1 pass through a first spray station in which they are coated from above, as FIG. 1 shows, whereupon they are coated from below in a second spray station, as FIG. 2 shows. Here, the same or another conveyor can be used. In one embodiment, after one coating process, the printed circuit board 1 can be turned over and then coated from above on the second side.

Figure 3:
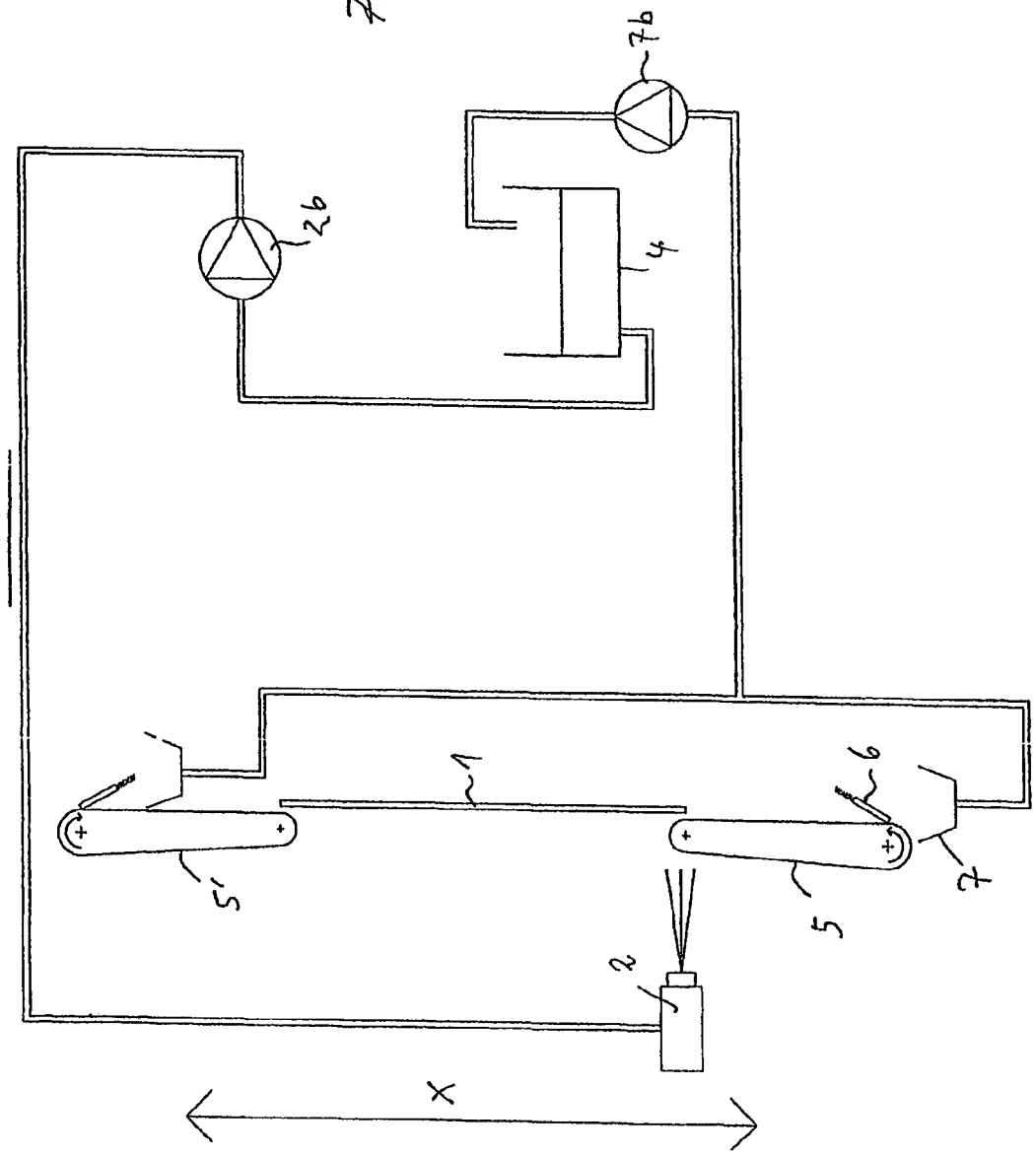

FIG. 3 shows an embodiment in which the printed circuit boards 1 are moved approximately vertically through the spray rig with a conveyor (not shown), wherein the spray gun 2 is moved vertically over the coating area.

Figure 4:
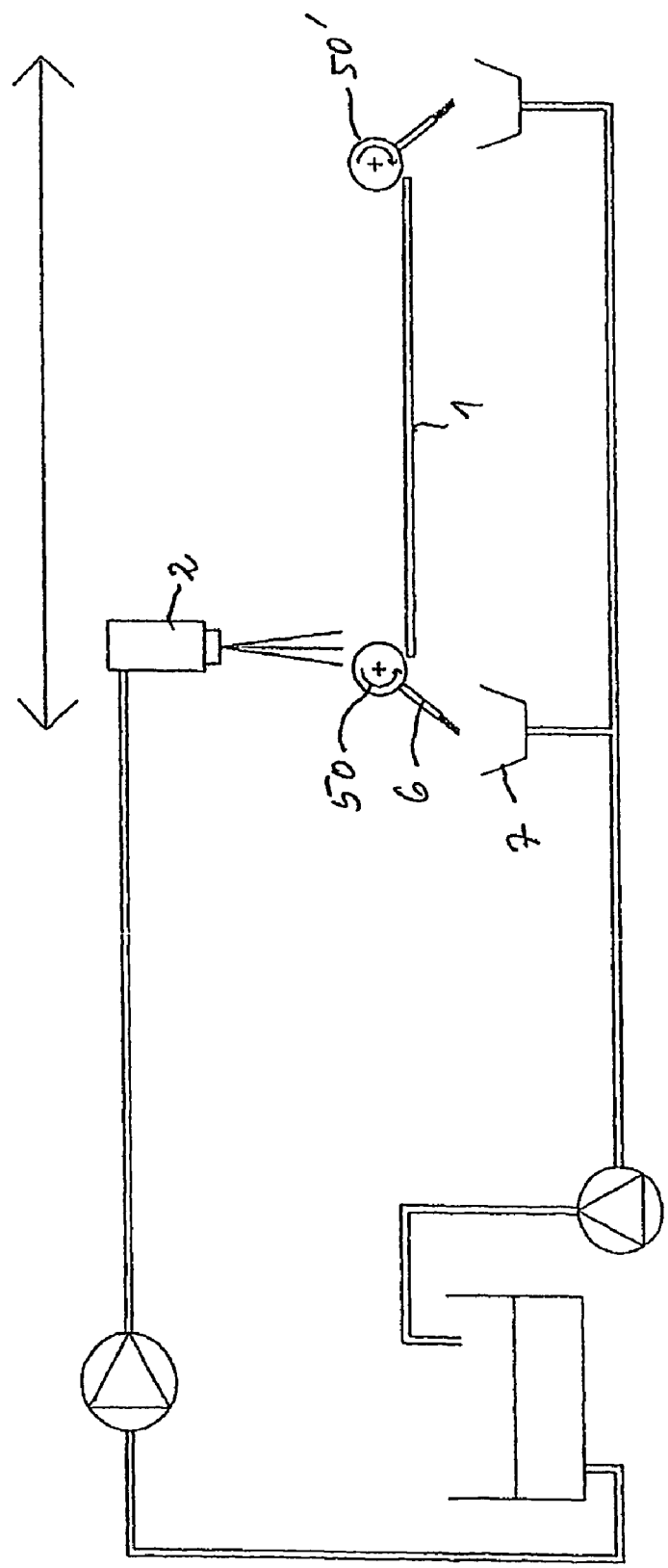
FIG. 4 shows a modified embodiment of the covering element at the edges of the printed circuit boards.

In the embodiment according to FIG. 4, the covering element comprises a drum 50, which covers the edge area 1*a* of the printed circuit board 1 by a part of its cross section. In this embodiment, too, the drum 50 revolves such that its circumferential surface in the edge area 1*a* is moved away from the printed circuit board 1.

FIG. 5 shows a perspective view of a covering unit, wherein the belt 5 is covered by a covering sheet 8 on the section remote from the coating area. Two arms 8*a* of the covering sheet extend along the edges of the belt 5 up to the support of the guide rollers 5*a* in a frame 9. The guide roller 5*a* can be inserted in the frame 9, for example, with a quick-release fastener, to facilitate changing and cleaning of the belt.

The exposed area of the belt 5 between the side arms 8*a* of the covering sheet 8 is used at the start of spraying of the printed circuit boards, for directing the spray jet onto this area of the belt which is remote from the coating area, until the jet is more fully developed and substantially free of impurities, whereupon the spray gun is directed away from the belt 5 and onto the printed circuit board. In other words, the cut-out in the covering sheet 8 is for adjusting the spray cone before the coating process, wherein the coating compound applied to the belt is wiped off and returned to the holding tank 4 or a corresponding pressure tank.

The spraying process begins and ends respectively in the area 5*c* of the belt 5 between the side arms 8*a* of the covering sheet 8, wherein the spray head 2 in area 5*c* can pass through a path which is sufficiently long for the perfect forming of the spray jet, that is, until no more droplet formation takes place and therefore a substantially perfect coating on the printed circuit board 1 is achieved. Here, a relatively high use of lacquer is obviously acceptable due to the provision of recycling. The interruption of the spraying process in area 5*c* permits the spray head 2 always to be driven up to the lateral stopper and the coating parameters (board feed and spray head movement speed) to be left constant independent of the board width.

The walls of the spray cabin (not shown) can be arranged, for example, abutting on the edges of the covering sheet 8 or of its arms 8*a*.

Reference numeral 10 designates a drive unit by which at least one of the guide rollers 5*a* and 5*b* is driven, and at which the revolving speed of the belt 5 can be adjusted depending on the speed of the spray head 2 and the throughput speed of the printed circuit boards 1 through the spray cabin. Simultaneously, the upward and downward displacement of the covered area of the belt 5 relative to the printed circuit board 1 can be integrated in such a drive unit.

The described covering element in the form of a belt 5 or a drum 50, whose axis extends in the conveying direction of the printed circuit boards, can also be used in a coating rig in which the printed circuit boards are coated by a pouring curtain. In such a coating rig with a pouring curtain, the width of the belt 5 or the length of the drum 50 can be designed shorter than in a spray coating, in which the spray cone of the spray gun impinges on a relatively wide strip on the surface of the printed circuit boards, while with the pouring curtain, only a very narrow strip is impinged by the coating compound.

Instead of continuous operation with continuously revolving belts, discontinuous operation is also possible if the printed circuit boards are not conveyed end-to-end through the spray cabin, but rather spaced apart from one another, so that the coating compound applied to the covering element can be conveyed off and wiped off in the time period during which the coating application is interrupted. In such an embodiment, a pivotable covering sheet can also be provided, which is pivoted out of the covering position to remove the coating compound applied thereto, whereupon the covering sheet can be pivoted back into the covering position.

It is known for a spraying process to convey the printed circuit boards end-to-end through the spray rig, so that the area under the printed circuit boards is not soiled by lacquer. This requires devices by which the printed circuit boards are displaced together end-to-end. After coating, the printed circuit boards would have to be displaced apart again or separated, so that they can be further processed.

In conventional spray rigs with pressure tanks, in each case approximately 5 to 10 printed circuit board dummies have to be pre-coated over a length of approximately 2000 to 4000 mm, until production with the desired spray pattern can be started. In addition, in each case, the last production plate may be followed by a printed circuit board dummy, so that the rig is not unnecessarily soiled. When the spray pattern is being developed by coating individual printed circuit boards, it is also necessary to work with printed circuit board dummies.

The coated printed circuit board dummies are washed with solvent and dried. Hereby, a considerable loss of expensive lacquer and cleaning agents arises. In the area of the production rig, an adequate number of printed circuit board dummies of different sizes may be kept available, because in the case of a change in the width of the printed circuit boards, dummies with a correspondingly matched width may be used.

To avoid these disadvantages, according to the invention, under the transport band for the printed circuit boards in the spraying area, there is arranged a belt, which revolves transverse to the conveying direction or in the conveying direction of the printed circuit boards, which belt is struck by the lacquer when a gap is present between the printed circuit boards during coating. With the revolving belt, the lacquer being applied is continuously transported off and supplied to a recycling element with, for example, a doctor blade.

Hereby, it is possible to convey printed circuit boards through the spraying area at a distance from one another, so that devices become unnecessary by which the printed circuit boards are pushed together end-to-end and isolated again afterwards. Further, no printed circuit board dummies are required for starting production, and the expense for cleaning and drying the dummies is eliminated. No lacquer loss occurs due to coated printed circuit board dummies, and the spray pattern can be set without much effort by coating single printed circuit boards. Altogether, this results in simple operation of the spray rig, and a high degree of automation is possible, wherein the interfaces to upstream and downstream machines are configured more simply. The spray rig can be made available for starting production at short notice, and only a minimal loss results due to sudden interruptions in production.

FIGS. 6 and 7 show an embodiment having a revolving belt under the spraying area, wherein for the same or corresponding components, the same reference numerals are used as in the preceding Figures.

FIG. 6 shows a coating device corresponding to FIG. 1, in which the printed circuit boards 1 are conveyed horizontally through the spraying area. Under the printed circuit boards 1 in the spraying area, there is arranged a belt 15 revolving transverse to the conveying direction of the printed circuit boards, which belt is guided around rollers 15a and 15b which have a distance from one another which is preferably greater than the width of a printed circuit board 1 shown in FIG. 6. In the embodiment of FIG. 6, the guide rollers 15a and 15b lie approximately under the guide rollers 5a of the belts 5 and 5' covering the edges of the printed circuit board 1. The width of the belt 15 vertical to the plane of the drawing is designed such that it extends at least over the spraying area of the spray gun 2, so that on both sides of a single printed circuit board 1, coating compound delivered from the spray gun strikes the belt 15 and the spray rig under the printed circuit boards 1 cannot be soiled. The coating compound striking the top side of the belt 15 is wiped off on the underside by a wiper 6' or a doctor blade and caught by a funnel 7', from where the coating compound is supplied to the holding tank 4 or to a recycling system.

The width of the belt 15 is designed independent of the size of the printed circuit boards to be coated, so that the coating compound strikes the belt 15 when single printed circuit boards 1 or printed circuit boards at a distance from one another are conveyed through the spraying area. Hereby, it is also possible to make the spray rig ready for production without a printed circuit board being located on the conveying system, because the coating compound delivered by the sprayer 2 strikes the belt 15 and is fed back into the cycle.

In the coating device of FIG. 7 corresponding to the embodiment in FIG. 3, the belt 15 revolving in a vertical direction is arranged in the spraying area behind the printed circuit boards 1 to be coated, wherein the wiper 6' is expediently arranged in the area of the lower guide roller or roll 15a, to wipe off the coating compound from the belt 15.

The belt 15, revolving behind or under the printed circuit boards to be coated in the spraying area for catching coating compound, can also be advantageously used in a spray rig in which no belts 5 or rollers 50 (FIG. 4) covering the edge areas of the printed circuit boards are present. In such an embodiment, the length of the belt 15 or the distance between its guide rollers 15a and 15b extends over a greater area than the width dimension of a printed circuit board 1 shown in the drawing, so that the belt 15 also catches coating compound which is sprayed past the edge areas of the printed circuit board 1 shown in the Figures.

It is also possible to permit the belt 15 forming a covering element to revolve in the conveying direction of the printed circuit boards 1 vertically to the plane of the drawing, wherein the belt 15 has a length and width at least covering the spraying area.

While the embodiments discussed have particularly shown and described certain inventive features, it will be understood by those of ordinary skill in the art that various changes in form and details may be made therein without departing from the spirit and scope of the present invention.

What is claimed is:

1. A device configured to coat a printed circuit board with a fluid coating compound which is sprayed onto the board surface, the device comprising:
   a conveyor for the printed circuit boards;
   a covering element on at least one side over an edge area of the printed circuit board, wherein the portion of the covering element covering the edge area of the printed circuit board can be moved away from the printed circuit board;
   a sprayer arranged over or under the conveyor, the sprayer configured to spray the coating compound onto a coating area, the coating area comprising a surface of the printed circuit board and the covering element; and
   a wiper, configured to wipe the coating compound moved away from the printed circuit board from the covering element and supply the wiped coating compound to a holding tank,
   wherein the covering element comprises a belt configured to revolve transverse to the conveying direction of the printed circuit boards, and wherein in the area of the edge, the belt is configured to be guided around a guide roller covering the edge area, and
   wherein the belt is covered by a covering sheet in an area remote from the coating area, and adjacent to the coating area a cut-out is provided in the covering sheet.

2. The device according to Claim 1, wherein the covering element comprises a drum whose axis extends in the conveying direction of the printed circuit board, wherein the drum covers the edge area of the printed circuit board with a part of its periphery.

3. The device according to Claim 1, wherein the wiper comprises a wiping blade by which the coating compound is wiped from the belt.

* * * * *